(12) United States Patent
Kasuya et al.

(10) Patent No.: US 6,433,636 B2
(45) Date of Patent: Aug. 13, 2002

(54) OPERATIONAL AMPLIFIER DESIGNED TO HAVE INCREASED OUTPUT RANGE

(75) Inventors: Hirokazu Kasuya, Aichi-ken; Mituhiro Saitou, Oobu, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/767,728

(22) Filed: Jan. 24, 2001

(30) Foreign Application Priority Data

Jan. 25, 2000 (JP) ........................................ 2000-015745
Oct. 10, 2000 (JP) ........................................ 2000-309082

(51) Int. Cl.⁷ .............................................. H03F 3/45
(52) U.S. Cl. ........................................ 330/255; 330/267
(58) Field of Search ............................. 330/255, 264, 330/267, 273, 292

(56) References Cited

U.S. PATENT DOCUMENTS

| 4,797,631 | A |   | 1/1989  | Hsu et al. ............ 330/253 |
|-----------|---|---|---------|-------------------------------|
| 5,475,343 | A | * | 12/1995 | Bee .................... 330/255 |
| 5,608,350 | A | * | 3/1997  | Ebukuro ............... 330/255 |
| 5,990,742 | A | * | 11/1999 | Suzuki ................. 330/255 |
| 6,137,356 | A | * | 10/2000 | Sakuragi ............... 330/292 |

FOREIGN PATENT DOCUMENTS

| JP | 60-239109 | 11/1985 |
| JP | 63-93207  | 4/1988  |
| JP | 64-64350  | 3/1989  |
| JP | 6-164250  | 6/1994  |
| JP | 8-222972  | 8/1996  |
| JP | 8-307164  | 11/1996 |
| JP | 2597690   | 1/1997  |

OTHER PUBLICATIONS

"$\mu$PC844—Single–power–source, high speed, wide–band quad. operational amplifying circuit", Industrial IC, p. 322, Aug. 20, 1993 (NEC Semiconductor Applied Techniques Center).

* cited by examiner

Primary Examiner—Robert Pascal
Assistant Examiner—Khanh Van Nguyen
(74) Attorney, Agent, or Firm—Law Offices of David G. Posz

(57) ABSTRACT

An operational amplifier is provided which includes a first and a second output transistor which are selectively activated as a function of a potential difference between input signals to an inverting input and a non-inverting input of the operational amplifier to establish a connection between an output terminal of the operational amplifier and a positive voltage side of a dc power supply or a connection between the output terminal and a negative voltage side of the dc power supply, thereby outputting a signal from the output terminal as a function of the potential difference between the input signals in a wider voltage range.

11 Claims, 5 Drawing Sheets

PRIOR ART

US 6,433,636 B2

OPERATIONAL AMPLIFIER DESIGNED TO HAVE INCREASED OUTPUT RANGE

BACKGROUND OF THE INVENTION

1 Technical Field of the Invention

The present invention relates generally to an operational amplifier designed to have an increased output range.

2 Background Art

FIG. 4 shows an example of conventional operational amplifiers. The shown operational amplifier includes a differential amplifier 50, an output circuit 60, and a control circuit 70. The differential amplifier 50 outputs a signal as a function of a potential difference between an input signal to a non-inverting input Tp (+input) and an input signal to an inverting input Tn (−input). The output circuit 60 is made of the so-called push-pull circuit including a pair of output transistors Tr61 and Tr62. The control circuit 70 controls the output transistors Tr61 and Tr62 as a function of the output of the differential amplifier 50 and outputs a signal as a function the potential difference between the input signal to the non-inverting input Tp and the input signal to the inverting input Tn from an output terminal To connected to a junction of the output transistors Tr61 and Tr62 (i.e., emitters of the transistors Tr61 and Tr62).

The differential amplifier 50 includes PNP transistors Tr50 and Tr51. The PNP transistor Tr50 connects at an emitter thereof with a power supply line Lv leading to a positive voltage terminal of a dc power supply (not shown) through a power supply terminal Tv and at a base thereof with a constant-current source (not shown) through a current control terminal Tc and outputs constant currents controlled by the constant-current source from three collectors thereof. Similarly, the PNP transistor Tr51 connects at an emitter thereof with the power supply line Lv and at a base thereof with the constant-current source through the current control terminal Tc and outputs constant currents from by the constant-current source from two collectors thereof.

Each of the transistors Tr50 and Tr51 works as a constant-current source for the differential amplifier 50. Specifically, the current outputted from each of the transistors Tr50 and Tr51 activates eight transistors Tr52 to Tr59, as described later in detail, to output the signal as a function of the potential difference between the input signal to the non-inverting input Tp and the input signal to the inverting input Tn.

The transistor Tr52 is a PNP transistor which connects at a base with the non-inverting input Tp, at an emitter with the first collector of the PNP transistor Tr51 through a diode D51, and at a collector with a ground line Lg. The ground line Lg is supplied with the power from the dc power supply (not shown) along with the power supply line Lv and connects with a negative voltage terminal of the dc power supply through a ground terminal Tg. The diode D51 connects at a cathode with the emitter of the PNP transistor Tr52 and at an anode with the first collector of the PNP transistor Tr51.

The transistor Tr53 is a PNP transistor which connects at a base with a junction of the anode of the diode D51 and the first collector of the PNP transistor Tr51 and at an emitter with the first collector of the PNP transistor Tr50.

The transistor Tr54 is a PNP transistor which connects at a base with the inverting input Tn, at an emitter with the second collector of the PNP transistor Tr51 through a diode D52, and at a collector with the ground line Lg. The diode D52 connects at a cathode with the emitter of the PNP transistor Tr54 and at an anode with the second collector of the PNP transistor T51.

The transistor Tr55 is a PNP transistor which connects at a base with a junction of the anode of the diode D52 and the second collector of the PNP transistor Tr51 and at an emitter with the first collector of the PNP transistor Tr50 along with the emitter of the PNP transistor Tr53.

The transistor Tr56 is a PNP transistor which connects at an emitter with the second collector of the PNP transistor Tr50, at a base with the collector of the PNP transistor Tr53, and at a collector with the ground line Lg.

The transistor Tr57 is a PNP transistor which connects at an emitter with the third collector of the PNP transistor Tr50, at a base with the collector of the PNP transistor Tr55, and at a collector with the ground line Lg.

The transistor Tr58 is an NPN transistor which connects at a collector with the collector of the PNP transistor Tr53 and the base of the PNP transistor Tr56 at an emitter with the ground line Lg, and at a base with the collector thereof.

The transistor Tr59 is an NPN transistor which connects at a collector with the collector of the PNP transistor Tr55 and the base of the PNP transistor Tr57 at an emitter with the ground line Lg, and at a base with the base of the PNP transistor Tr58 to form a current mirror along with the NPN transistor Tr58.

The control circuit 70 also includes PNP transistors Tr70 and Tr71 and six transistors Tr72 to Tr77 activated by a supply of power from the transistors Tr70 and Tr71. The PNP transistor Tr70 connects at an emitter thereof with the power supply line Lv, and at a base thereof with the constant-current source through the current control terminal Tc and outputs constant currents from by the constant-current source from four collectors thereof. Similarly, the PNP transistor Tr71 connects at an emitter thereof with the power supply line Lv and at a base thereof with the constant-current source through the current control terminal Tc and outputs constant currents from by the constant-current source from five collectors thereof.

The transistor Tr72 is an NPN transistor which connects at a base with the emitter of the PNP transistor Tr57, at a collector with the first collector of the PNP transistor Tr70, and at an emitter with the ground line Lg through a resistor R71.

The transistor Tr73 is an NPN transistor which connects at a base with the emitter of the NPN transistor Tr72, at an emitter with the ground line Lg, and at a collector with the base of the PNP transistor Tr57 through a phase compensating capacitor C71, the bases of the output transistors Tr61 and Tr62 of the output circuit 60, and the five collectors of the PNP transistor Tr71.

The transistor Tr74 is an NPN transistor which connects at an emitter with the collector of the NPN transistor Tr72 and the first collector of the PNP transistor Tr70, and at a collector with the ground line Lg, and at a base with the second to fourth collectors of the PNP transistor Tr70.

The transistor Tr75 is an NPN transistor which connects at a collector with the base of the PNP transistor Tr74 (i.e., the second to fourth collectors of the PNP transistor Tr70), at an emitter with the ground line Lg, and at a base with a collector thereof.

The transistor Tr76 is an NPN transistor which connects at a collector with the output terminal To, at an emitter with the ground line Lg, and at a base with the base of the NPN transistor Tr75 to form a current mirror along with the NPN transistor Tr75.

The transistor Tr77 is an NPN transistor which connects at a collector with the five collectors of the PNP transistor Tr71 (i.e., the bases of the output transistors Tr61 and Tr62 of the output circuit 60 and the collector of the NPN transistor Tr76), at an emitter with the collector of the NPN transistor Tr76 (i.e., the output terminal To), at a base directly with the emitter of the output transistor Tr61 and with the emitter of the output transistor Tr62 through a resistor R61.

In the output circuit 60, the output transistor Tr61 connects at the collector with the power supply line Lv. The output transistor Tr62 connects at the collector with the ground line Lg and at the emitter with the emitter of the output transistor Tr61 through the resistor R61 and with the output terminal To.

In operation, when the differential amplifier 50 receives the input signals to the non-inverting input Tp and the inverting input Tn through the PNP transistors Tr52 and Tr54, it produces a signal as a function of a difference between currents (i.e., a potential difference) flowing through the transistors Tr52 and Tr54. The control circuit 70 amplifies the signal inputted from the differential amplifier 50 to activate the pair of the output transistors Tr61 and Tr62 of the output circuit 60 simultaneously.

Specifically, the signal is outputted from the output terminal To as a function of the potential difference between the signals inputted to the non-inverting input Tp and the inverting input Tn. The phase-compensating capacitor C71 disposed between a path for the output transistor-driving signal extending from the control circuit 70 to the output circuit 60 and a path of the current-amplifying circuit on the side of the non-inverting input Tp serves to avoid oscillation of the operational amplifier.

The differential amplifier 50 of the above described operational amplifier produces a signal as a function of the potential difference between the input signals to the non-inverting input Tp and the inverting input Tn to drive the output transistors Tr61 and Tr62 simultaneously. Specifically, a drive system for the output transistors Tr61 and Tr62 in the control circuit 70 is made of a single line. The output circuit 60 is made of the so-called push-pull circuit in which the output transistor Tr61 on the positive voltage side is implemented by an NPN transistor, and the output transistor Tr62 on the negative voltage side is implemented by a PNP transistor. The operational amplifier, thus, needs to install the NPN transistor Tr73 between the base of each of the output transistors Tr61 and Tr62 connected together and the ground line Lg and control the base voltage of each of the output transistor Tr61 and Tr62 (i.e., the output voltage from the output terminal To). This causes a minimum output voltage from the output terminal To to be, as indicated by a solid line in FIG. 5(b), a voltage (Vce+Vf= approximately 0.8V) that is higher than the voltage of the ground line Lg (i.e., ground potential) by the sum of the collector-emitter voltage Vce (approximately 0.1V) of the NPN transistor Tr73 and the emitter-base forward voltage Veb (the so-called Vf=approximately 0.7V) of the output transistor Tr62.

In order to control the base voltage of each of the output transistors Tr61 and Tr62, the constant current is supplied from the PNP transistor Tr71 to the drive line for each of the output transistors Tr61 and Tr62. The PNP transistor Tr71 is disposed between the base of the output transistor Tr61 and the power supply line Lv. This causes a maximum output voltage from the output terminal To to be, as indicated by the solid line in FIG. 5(b), a voltage (Vcc−(Vce+Vf)) that is lower than the voltage of the power supply line Lv (i.e., the source voltage Vcc=approximately 0.1V) by the sum of the collector-emitter voltage Vce (approximately 0.1V) of the NPN transistor Tr71 and the emitter-base forward voltage Veb (i.e., Vf=approximately 0.7V) of the output transistor Tr61.

Note that FIG. 5(b) represents a change in output voltage Vout from the output terminal To when the input voltage Vin to a non-inverting input of an operational amplifier, as shown in FIG. 5(a), which connects at an output thereof with an inverting input thereof to define the so-called voltage follower is changed from 0V to the source voltage Vcc.

As apparent from the above, an output voltage range (i.e., a dynamic range) over which the voltage is outputted from the output terminal To is between (Vbe+Vce) and (Vcc− (Vbe+Vce)), thus requiring the dynamic range of the operational amplifier to be increased further.

In recent years, semiconductor devices tend to be made of an LSI for the multiplicity of functions. An increase in operational speed and a reduction in size are required. These requirements, however, result in an increase in power consumption and difficulty in dissipating the heat from the semiconductor devices. Further, the semiconductor devices are also required to be operated by a portable battery. To decrease the power consumption and operate the semiconductor devices by the portable battery, the source voltage required by the semiconductor devices needs to be lowered.

The operational amplifier used as one component of the semiconductor device, however, encounters the drawback in that the lowering of the source voltage results in a decrease in voltage range of the output signal, thus causing an S/N ratio to deteriorate. Particularly, in the above operational amplifier not using a negative power supply, a minimum output voltage is, as described above, higher than the ground voltage of the dc power supply by approximately 0.8V (=Vbe+Vce), while a maximum output voltage is lower than the source voltage by approximately 0.8V (=Vbe+Vce). Thus, if the source voltage Vcc of the dc power supply is lowered from a typical voltage 5V to 3V, for example, it will cause an available output voltage range to be narrowed greatly to 0.8V to 2.2V, encountering a difficulty in ensuring the quality of an output signal. For this reason, the output voltage range of the operational amplifier delimited as a function of the source voltage has been required to be increased.

In order to increase the output voltage range (i.e., the dynamic range) of the operational amplifier, there has been proposed a circuit structure, as shown in FIG. 5(c), in which the voltage higher than the source voltage Vcc by approximately 1V is applied to an output transistor (NPN transistor) on a positive voltage side of a push-pull circuit working as an output stage of the operational amplifier, and the voltage lower than the ground voltage by approximately 1V is applied to an output transistor (PNP transistor) on a negative voltage side, thereby increasing the output voltage range from approximately 0V up to the source voltage Vcc. This structure, however, requires a voltage converter made by a step-up circuit for producing the voltage to be applied to the push-pull circuit. The formation of such a voltage converter in an IC constituting the operational amplifier will cause switching noises to arise upon voltage conversion as well as an increase in manufacturing cost and also requires the operational amplifier to be designed to withstand higher voltages. It, thus, becomes necessary to modify the design of the IC greatly. An IC of this type are, as the case my be, not available.

SUMMARY OF THE INVENTION

It is therefore a principal object of the invention to avoid the disadvantages of the prior art.

It is another object of the invention to provide an operational amplifier which is designed to have an increased output voltage range without applying a stepped up source voltage to output transistors.

According to one aspect of the invention, there is provided an operational amplifier which comprises: (a) a differential amplifier including a first input transistor connected to an inverting input and a second input transistor connected to a non-inverting input, the differential amplifier being responsive to the input signal to the inverting input to establish a current flow through the first input transistor to provide a first signal and responsive to the input signal to the non-inverting input to establish a current flow through the second input transistor to provide a second signal; (b) an output circuit including a first output transistor which is disposed in a current line extending from a positive voltage side of a dc power supply to an output terminal of the operational amplifier and which connects at a first terminal with the positive voltage side of the dc power supply and at a second terminal with the output terminal and a second output transistor which is disposed in a current line extending from a negative voltage side of the dc power supply to the output terminal and which connects at a first terminal with the output terminal and at a second terminal with the negative voltage side of the dc power supply; (c) a control circuit supplied with a power from the dc power supply to control the output circuit, the control circuit working to produce a first drive signal to develop a drive voltage across the second terminal and a control terminal of the first output transistor in response to the first signal inputted from the differential amplifier and to produce a second drive signal to develop a drive voltage across the second terminal and a control terminal of the second output transistor in response to the second signal inputted from the differential amplifier so as to output a signal from the output terminal as a function of the potential difference between the input signals to the inverting input and the non-inverting input, the control circuit including a first control circuit designed to be responsive to the first signal outputted from the differential amplifier to control the first drive signal so as to decrease a current flowing through the first output transistor as a potential of the input signal to the inverting input rises and a second control circuit designed to be responsive to the second signal outputted from the differential amplifier to control the second drive signal so as to decrease a current flowing through the second output transistor as a potential of the input signal to the non-inverting input rises; and (d) phase-compensating capacitors disposed between the output terminal of the operational amplifier and a portion of the first control circuit leading to the control terminal of the first output transistor and between the output terminal of the operational amplifier and a portion of the second control circuit leading to the control terminal of the second output transistor.

In the preferred mode of the invention, the first output transistor is implemented by an NPN transistor which has a collector connected to the positive voltage side of the dc power supply as the first terminal, an emitter connected to the output terminal of the operational amplifier as the second terminal, and a base working as the control terminal into which the first drive signal is inputted. The second output transistor is implemented by an NPN transistor which has a collector connected to the output terminal of the operational amplifier as the first terminal, an emitter connected to the negative voltage side of the dc power supply as the second terminal, and a base working as the control terminal into which the second drive signal is inputted.

The differential amplifier includes a first differential amplifier circuit having disposed therein the first and second input transistors and a second differential amplifier circuit having a first and a second transistor which are connected to the first and second input transistors, respectively, and which produce the first and second signals as functions of currents flowing through the first and second transistors, respectively.

The inverting input is coupled to the output terminal to form the operational amplifier as a voltage follower which supplies a power to an external device connected to the output terminal as a function of the input signal to the non-inverting input.

According to the second aspect of the invention, there is provided an operational amplifier which comprises: (a) a differential amplifier including a first input transistor connected to an inverting input and a second input transistor connected to a non-inverting input, the differential amplifier being responsive to the input signal to the inverting input to establish a current flow through the first input transistor to provide a first signal and responsive to the input signal to the non-inverting input to establish a current flow through the second input transistor to provide a second signal; (b) an output circuit including a first output transistor which is disposed in a current line extending from a positive voltage side of a dc power supply to an output terminal of the operational amplifier and which connects at a first terminal with the positive voltage side of the dc power supply and at a second terminal with the output terminal and a second output transistor which is disposed in a current line extending from a negative voltage side of the dc power supply to the output terminal and which connects at a first terminal with the output terminal and at a second terminal with the negative voltage side of the dc power supply; (c) a control circuit supplied with a power from the dc power supply to control the output circuit, the control circuit working to produce a first drive signal to develop a drive voltage across the first terminal and a control terminal of the first output transistor in response to the first signal inputted from the differential amplifier and to produce a second drive signal to develop a drive voltage across the second terminal and a control terminal of the second output transistor in response to the second signal inputted from the differential amplifier so as to output a signal from the output terminal as a function of the potential difference between the input signals to the inverting input and the non-inverting input, the control circuit including a first control circuit designed to be responsive to the first signal outputted from the differential amplifier to control the first drive signal so as to decrease a current flowing through the first output transistor as a potential of the input signal to the inverting input rises and a second control circuit designed to be responsive to the second signal outputted from the differential amplifier to control the second drive signal so as to decrease a current flowing through the second output transistor as a potential of the input signal to the non-inverting input rises; and (d) phase-compensating capacitors disposed between the output terminal of the operational amplifier and a portion of the first control circuit leading to the control terminal of the first output transistor and between the output terminal of the operational amplifier and a portion of the second control circuit leading to the control terminal of the second output transistor.

In the preferred mode of the invention, the first output transistor is implemented by a PNP transistor which has an emitter connected to the positive voltage side of the dc power supply as the first terminal, a collector connected to the output terminal of the operational amplifier as the second terminal, and a base working as the control terminal into which the first drive signal is inputted. The second output transistor is implemented by an NPN transistor which has a collector connected to the output terminal of the operational amplifier as the first terminal, an emitter connected to the negative voltage side of the dc power supply as the second terminal, and a base working as the control terminal into which the second drive signal is inputted.

The differential amplifier includes a first differential amplifier circuit having disposed therein the first and second input transistors and a second differential amplifier circuit having a first and a second transistor which are connected to the first and second input transistors, respectively, and which produce the first and second signals as functions of currents flowing through the first and second transistors, respectively.

The inverting input is coupled to the output terminal to form the operational amplifier as a voltage follower which supplies a power to an external device connected to the output terminal as a function of the input signal to the non-inverting input.

According to the third aspect of the invention, there is provided an operational amplifier which comprises: (a) a differential amplifier producing an output signal as a function of a potential difference between an input signal to an inverting input and an input signal to a non-inverting input; (b) an output circuit including a first output transistor which is disposed in a circuit line extending from a positive voltage side of a dc power supply to an output terminal of the operational amplifier and a second output transistor which is disposed in a circuit line extending from a negative voltage side of the dc power supply to the output terminal; and (c) a control circuit controlling the output circuit, the control circuit working to produce a first drive signal and a second drive signal having different levels as a function of the output signal from the differential amplifier, the first drive signal working to activate the first output transistor as a function of the level of the first drive signal to establish a connection between the output terminal and the positive voltage side of the dc power supply through the first output transistor, the second drive signal working to activate the second output transistor as a function of the level of the second drive signal to establish a connection between the output terminal and the negative voltage side of the dc power supply through the second output transistor, thereby outputting a signal from the output terminal as a function of the potential difference between the input signals to the inverting input and the non-inverting input.

In the preferred mode of the invention, when the input signal to the non-inverting input is at a higher level substantially equal to a potential of the positive voltage side of the dc power supply, and the input signal to the inverting input is at a lower level substantially equal to a potential of the negative voltage side of the dc power supply, the first drive signal activates the first output transistor to establish the connection between the output terminal and the positive voltage side of the dc power supply, and the second drive signal deactivates the second output transistor to block the connection between the output terminal and the negative voltage side of the dc power supply. When the input signal to the non-inverting input is at the lower level, and the input signal to the inverting input is at the higher level, the first drive signal deactivates the first output transistor to block the connection between the output terminal and the positive voltage side of the dc power supply, and the second drive signal activates the second output transistor to establish the connection between the output terminal and the negative voltage side of the dc power supply.

The first output transistor is implemented by a bipolar transistor which connects at a collector with the output terminal, at an emitter with the positive voltage side of the dc power supply, and at a base with the control circuit. The second output transistor is implemented by a bipolar transistor which connects at a collector with the output terminal, at an emitter with the negative voltage side of the dc power supply, and at a base with the control circuit.

The first output transistor is implemented by a MOSEFT which connects at a drain with the output terminal, at a source with the positive voltage side of the dc power supply, and at a gate with the control circuit. The second output transistor is implemented by a MOSFET which connects at a drain with the output terminal, at a source with the negative voltage side of the dc power supply, and a gate with the control circuit.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings:

FIG. 5(*b*) is a graph which shows output voltage ranges in a conventional operational amplifier and an operational amplifier of the invention; and FIG. 5(*c*) is a block diagram which shows another example of a conventional operational amplifier.

DESCRIPTION OF THE PREFERRED EMBODIMENTS

Figure 1:
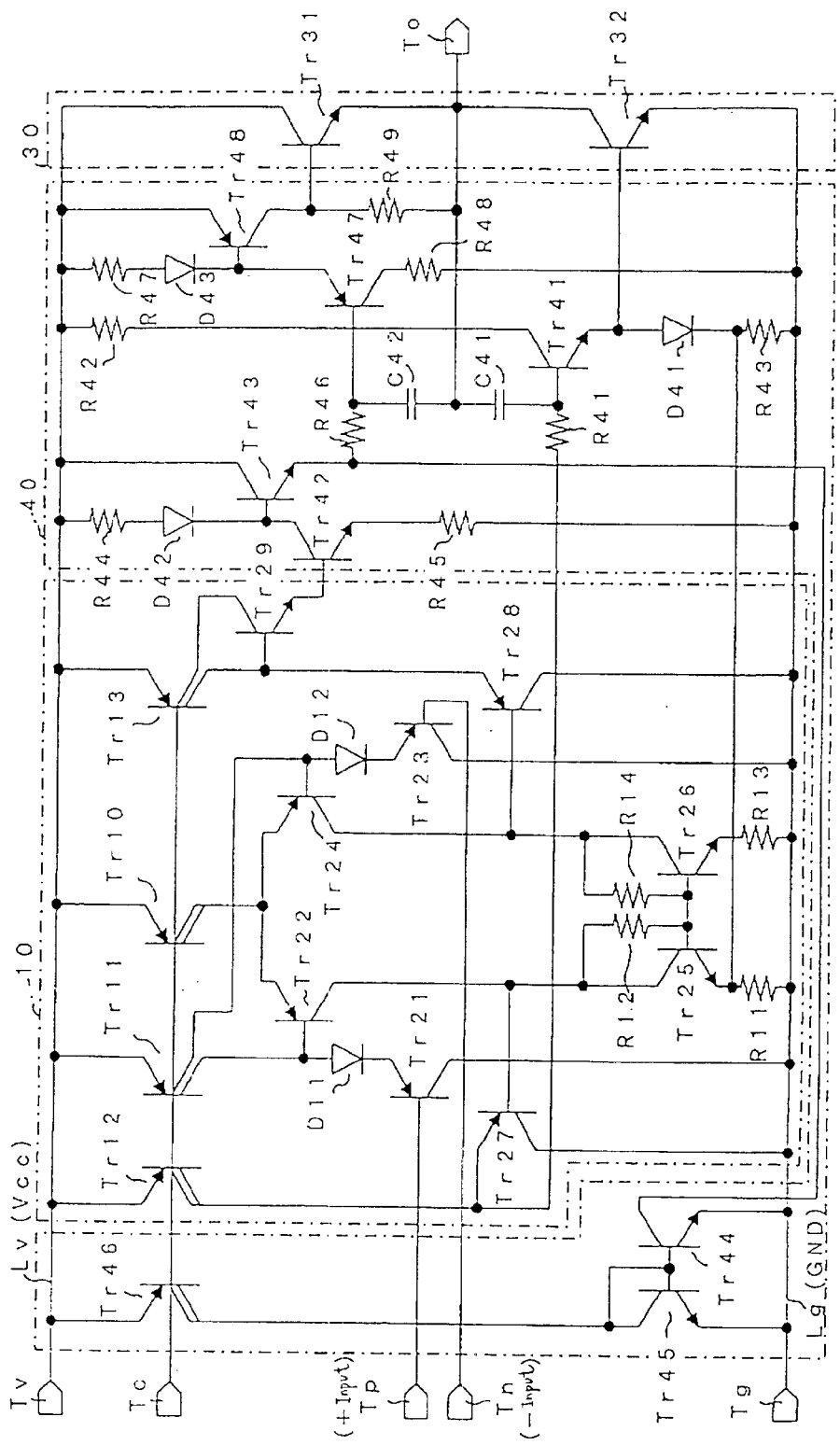
FIG. 1 is a circuit diagram which shows an operational amplifier according to the first embodiment of the invention.

Referring to the drawings, wherein like reference numbers refer to like parts in several views, particularly to FIG. 1, there is shown an operational amplifier according to the first embodiment of the invention.

The operational amplifier includes a differential amplifier 10, an output circuit 30, and a control circuit 40. The differential amplifier 10 outputs a signal as a function of a potential difference between an input signal to a non-inverting input Tp (+input) and an input signal to an inverting input Tn (−input). The output circuit 30 is made up of output transistors Tr31 and Tr32 which are installed in a current path on the positive voltage side extending from a power supply line Lv to an output terminal To and a current path on the negative voltage side extending from the output terminal To to a ground line Lg, respectively. The control circuit 40 controls the output transistors Tr31 and Tr32 as a function of the output of the differential amplifier 10 and outputs a signal as a function the potential difference between the input signal to the non-inverting input Tp and the input signal to the inverting input Tn from the output terminal To.

The output transistors Tr31 and Tr32 of the output circuit 30 are each implemented by an NPN transistor. The first output transistor Tr31 connects at a collector with the power supply line Lv and at an emitter with the output terminal To. The second output transistor Tr32 connects at a collector with the output terminal To and at an emitter with the ground line Lg.

The differential amplifier 10 includes PNP transistors Tr10, Tr11, Tr12, and Tr13 each of which connects an emitter with the power supply line Lv leading to a positive voltage terminal of a dc power supply (not shown) through a power supply terminal Tv and at a base thereof with an external constant-current source (not shown) through a current control terminal Tc and works as a constant-current source to output constant currents controlled by the constant-current source from two collectors thereof.

The differential amplifier 10 also includes nine transistors Tr21 to Tr29 activated by output currents from the collectors of the transistors Tr10 to Tr13.

Figure 4:
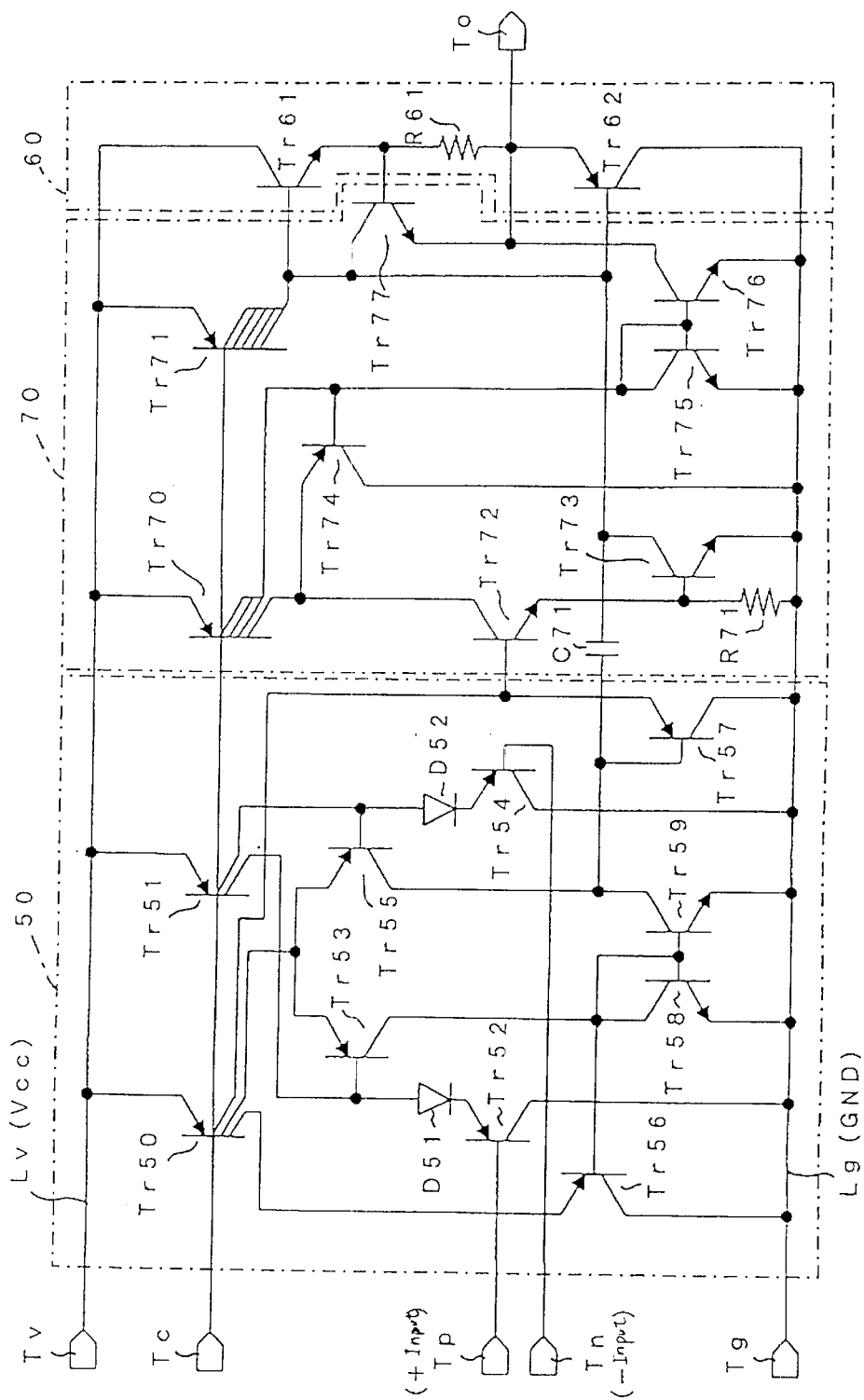
FIG. 4 is a circuit diagram which shows a conventional operational amplifier.

The transistor Tr21 is a PNP transistor which connects at a base with the non-inverting input Tp, at an emitter with the first collector of the PNP transistor Tr11 through a diode D11, and at a collector with the ground line Lg and works as a second input transistor. The ground line Lg is, like the one shown in FIG. 4, connected to the negative voltage side of the dc power source through a ground terminal Tg. The diode D11 connects at a cathode with the emitter of the PNP transistor Tr21 and at an anode with the first collector of the PNP transistor Tr11.

The transistor Tr22 is a PNP transistor which connects at a base with a junction of the anode of the diode D11 and the first collector of the PNP transistor Tr11 and at an emitter with the first and second collectors of the PNP transistor Tr10.

The transistor Tr23 is a PNP transistor which connects at a base with the inverting input Tn, at an emitter with the second collector of the PNP transistor Tr11 through a diode D12, and at a collector with the ground line Lg and works as a first input transistor. The diode D12 connects at a cathode with the emitter of the PNP transistor Tr23 and at an anode with the second collector of the PNP transistor Tr11.

The transistor Tr24 is a PNP transistor which connects at a base with a junction of the anode of the diode D12 and the second collector of the PNP transistor Tr11 and at an emitter with the first and second collectors of the PNP transistor Tr10 along with the emitter of the PNP transistor Tr22.

The transistor Tr25 is a PNP transistor which connects at a collector with the collector of the PNP transistor Tr22, at an emitter with the ground line Lg through a resistor R11, and at a base with the collector thereof through a resistor R12.

The transistor Tr26 is an NPN transistor which connects at a collector with the collector of the PNP transistor Tr24, at an emitter with the ground line Lg through a resistor R13, and at a base with the base of the NPN transistor Tr25 and its own collector through a resistor R14.

The transistor Tr27 is a PNP transistor which connects at a base with a junction of the collector of the NPN transistor Tr25 and the connector of the PNP transistor Tr22, at an emitter with the first and second collectors of the PNP transistor Tr12, and a collector with the ground line Lg.

The transistor Tr28 is a PNP transistor which connects at a base with a junction of the collectors of the NPN transistor Tr26 and the PNP transistor Tr24, at an emitter with the first collector of the PNP transistor Tr13, and at a collector with the ground line Lg.

The transistor Tr29 is an NPN transistor which connects at a base with a junction of the emitter of the NPN transistor Tr28 and the first collector of the PNP transistor Tr13 and at a collector with the second collector of the PNP transistor Tr13.

The control circuit 40 also includes NPN transistors Tr41 and Tr42 which work as signal input transistors receiving an output from the differential amplifier 10. The NPN transistor Tr41 connects at a base with a junction of the collector of the PNP transistor Tr27 and the first and second collectors of the PNP transistor Tr12 through a resistor R41. The NPN transistor Tr42 connects at a base with the emitter of the NPN transistor Tr29.

The NPN transistor Tr41 also connects at a collector with the power supply line Lv through the resistor R42 and at an emitter directly with the base of the second output transistor Tr32 of the output circuit 30 and with the ground line Lg through the diode D41 and the resistor R43. The base of the NPN transistor Tr41 is also connected to the output terminal To through a phase compensating capacitor C41.

The diode D41 connects at an anode with the emitter of the NPN transistor Tr41 and at a cathode with the ground line Lg through the resistor R43. A junction of the cathode of the diode D41 and the resistor R43 is coupled to a junction of the emitter of the NPN transistor Tr25 and the resistor R11.

The NPN transistor Tr42 also connects at an emitter with the ground line Lg through a resistor R45 and at a collector with the base of the NPN transistor Tr42 and with the power supply line Lv through the diode D44 and the resistor R44. The diode D44 connects at a cathode with the collector of the NPN transistor Tr42 and at an anode with the power supply line Lv through the resistor R44.

The control circuit 40 also includes an NPN transistor Tr43 which connects at a collector with the power supply line Lv and at an emitter with a collector of an NPN transistor Tr44. The NPN transistor Tr44 connects at an emitter with the ground line Lg and at a base with a base of an NPN transistor Tr45.

The NPN transistor Tr45 forms a current mirror together with the NPN transistor Tr44 and has a base and a collector connected together. The collector of the NPN transistor Tr45 is also connected to a collector of a PNP transistor Tr46 serving as a constant-current source.

The transistor Tr46 connects at an emitter, like the PNP transistors Tr10 to Tr13 installed in the differential amplifier 10, with the power supply line Lv and at a base with the external constant-current source through the current control terminal Tc and output constant currents controlled by the constant-current source from two collectors. The NPN transistor Tr45 also connects at a collector with first and second collectors of the PNP transistor Tr46.

To a junction of the emitter of the NPN transistor Tr43 and the collector of the NPN transistor Tr44, the base of the PNP transistor Tr47 is connected through the resistor R46. The PNP transistor Tr47 connects at a collector with the ground line Lg through the resistor R48 and at an emitter directly with the base of the PNP transistor Tr48 and with the power supply line Lv through the resistor R47 and the diode D43.

The PNP transistor Tr48 also connects at an emitter directly with the power supply line Lv and at a collector directly with the base of the first output transistor Tr31 and with the output terminal To through the resistor R49.

The diode D43 connects at a cathode with the emitter of the PNP transistor Tr47 and at an anode with the power supply line Lv through the resistor R47. The PNP transistor Tr47 connects at a base with the output terminal To through a phase-compensating capacitor C42.

Operations of the thus-constructed operational amplifier will be described below. Note that the following discussion will refer only to the operation when each of maximum and minimum voltage signals is outputted from the output terminal To, and no attempt will be made here to describe the operation when a middle voltage signal is outputted from the output terminal To because it can be easily understood by one of ordinary skill in the art and not an essential part of the invention.

When a high-level signal nearly equal to the source voltage Vcc is inputted to the inverting input Tn, and a low-level signal nearly equal to the ground potential is inputted to the non-inverting input Tp, the first input transistor Tr23 is turned off, while the second input transistor Tr21 is turned on. This causes the PNP transistor Tr24 and the PNP transistor Tr10 of the differential amplifier 10 to be turned off and on, respectively, so that the current supplied from the PNP transistor Tr10 flows into the NPN transistor Tr25 through the PNP transistor Tr22, while the current supplied from the PNP transistor Tr10 does not flow into the NPN transistor Tr26.

The NPN transistors Tr25 and Tr26, as described above, have the bases connected together to form the current mirror, so that the NPN transistor Tr26 operates to allow the same current as that flowing through the NPN transistor Tr25 to flow therethrough. This causes the PNP transistor Tr28 to be turned on to input the current supplied from the PNP transistor Tr13 to the NPN transistor Tr26 and the PNP transistor Tr27 to be turned off.

When the PNP transistor Tr27 is turned off, it will cause the base current of the PNP transistor Tr12 of the differential amplifier 10 to flow to the NPN transistor Tr41 of the control circuit 40, so that the NPN transistor Tr41 is turned on.

When the NPN transistor Tr41 is turned on, it will cause a current path to be formed which extends from the power supply line Lu to the ground line Lg through the resistor R42, the NPN transistor Tr41, the diode D41, and the resistor R43, so that a drive voltage (i.e., a bias voltage) is developed across the base and the emitter of the second output transistor Tr32 of the output circuit 30 to turn on the second output transistor Tr32.

When the PNP transistor Tr28 of the differential amplifier 10 is turned on, it will cause no current to be supplied to the base of the NPN transistor Tr29, so that the NPN transistor Tr29 is turned off. This also causes the current (also referred to as a first signal below) not to be supplied from the NPN transistor Tr29 to the base of the NPN transistor Tr42 of the control circuit 40, so that the NPN transistor Tr42 to be turned off.

The NPN transistor Tr43 of the control circuit 40 is, thus, turned on to input the same current as that supplied from the PNP transistor Tr46 to the NPN transistor Tr45 to the NPN transistor Tr44. This causes the base potential of the PNP transistor Tr47 to be at a high-level, so that the PNP transistor Tr47 is turned off, and the PNP transistor Tr48 is turned off.

Therefore, no current flows to the resistor R49 connected between the base and the emitter of the first output transistor Tr31 of the output circuit 30, so that no voltage is developed across the base and the emitter of the first output transistor Tr31 through the resistor R49, thereby turning off the first output transistor Tr31.

Specifically, when the inverting input Tn is at the high level, while the non-inverting input Tp is at the low-level, the first output transistor Tr31 is turned off, while the second output transistor Tr32 is turned on, so that the output terminal To is connected to ground through the second output transistor Tr32 and the ground line Lg. The potential at the output terminal To (i.e., the output voltage) becomes higher than the ground voltage (0V) by the collector-emitter voltage Vce (approximately 0.1V) of the second output transistor Tr32 when turned on. Alternatively, when the low-level signal at approximately the ground voltage is inputted to the inverting input Tn, while the high-level signal at approximately the source voltage Vcc is inputted to the non-inverting input Tp, the first input transistor Tr23 is turned on, while the second input transistor Tr21 is turned off, so that in the differential amplifier 10, the PNP transistor Tr24 is turned on, while the PNP transistor Tr22 is turned off, thereby causing the current supplied from the PNP transistor Tr10 to flow to the NPN transistor Tr26 through the PNP transistor Tr24 without a current flow from the PNP transistor Tr10 to the NPN transistor Tr25. The current supplied from the PNP transistor Tr12, thus, flows to the NPN transistor Tr10 through the PNP transistor Tr27 to turn on the PNP transistor Tr27. The PNP transistor Tr28 is turned off because no current flows to the NPN transistor Tr26, so that the NPN transistor Tr29 is turned on.

When the PNP transistor Tr27 is, as described above, turned on, the flow of base current serving as the second signal to the NPN transistor Tr41 of the control circuit 40 is stopped, thereby turning off the NPN transistor Tr41, so that the second output transistor Tr32 is turned off.

When the NPN transistor Tr29 is, as described above, turned on, the flow of base current serving as the first signal to the NPN transistor Tr42 of the control circuit 40 is initiated, thereby turning on the NPN transistor Tr42, so that the NPN transistor Tr43 is turned off. This causes the PNP transistor Tr47 of the control circuit 40 to operate to allow the current to flow to the NPN transistor Tr44, thereby turning on the PNP transistor Tr47 to turn on the PNP transistor Tr48.

Therefore, the current flows through the resistor R49, so that the potential difference (i.e., drive voltage) is developed across the base and the emitter of the first output transistor Tr31 of the output circuit 30, thereby turning on the first output transistor Tr31.

Specifically, when the low-level signal and the high-level signal are inputted to the inverting input Tn and the non-inverting input Tp, respectively, the first output transistor Tr31 is turned on, while the second output transistor Tr32 is turned off to establish a connection between the output terminal To and the power supply line Lv through the first output transistor Tr31.

The potential at the output terminal To (i.e., the output voltage) becomes lower than the source voltage Vcc by the sum of the base-emitter forward voltage Vf (approximately 0.7V) of the first output transistor Tr31 and the collector-emitter voltage Vce (approximately 0.1V) of the PNP transistor Tr48.

Figure 5A:
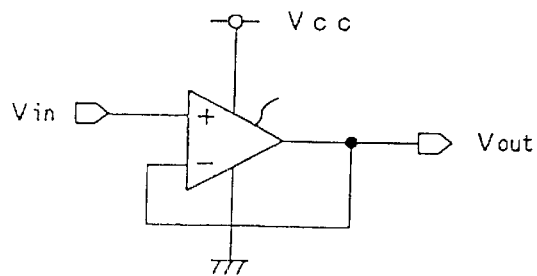
FIG. 5(*a*) is a block diagram which shows a conventional operational amplifier.
Figure 5B:
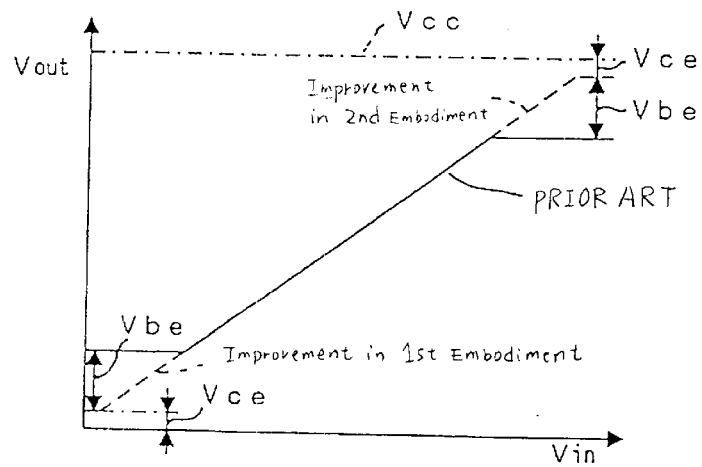
Figure 5C:
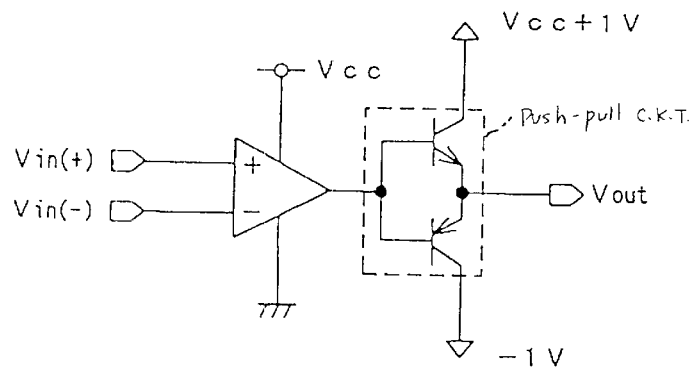

As apparent from the above discussion, the operational amplifier of this embodiment has the range of Vce to (Vcc−(Vf+Vce)) over which the voltage can be outputted from the output terminal To. This allows a minimum output voltage to be lower than that in the conventional operational amplifier of FIG. 4 by the base-emitter forward voltage Vf (approximately 0.7V) of the first output transistor Tr31 (see a broken line in FIG. 5(b)). Specifically, a minimum output voltage of the operational amplifier may be set to a lower voltage in the vicinity of the ground potential, thus establishing a desired dynamic range even when the source voltage is lowered.

The widening of the output voltage range of the operational amplifier is, as described above, achieved by making both the first output transistor Tr31 and the second output transistor Tr32 of NPN transistors and controlling them based on input signals to the non-inverting input Tp and the inverting input Tn. Specifically, the differential amplifier 10 is designed to input as the second signal the base current to one of two signal input transistors of the control circuit 40 (i.e., the NPN transistor Tr41) as a function of the electric potential of an input signal to the non-inverting input Tp and input as the first signal to the base current to the other signal input transistor (i.e., the NPN transistor Tr42) as a function of the electric potential of an input signal to the inverting input Tn. The control circuit 40 is designed to drive the second output transistor Tr32 and the first output transistor Tr31 as functions of currents flowing through the transistors Tr41 and Tr42, respectively.

The control circuit 40, thus, has two drive systems: one includes a first control circuit consisting of the transistors Tr42 to Tr48, the resistors R44 to R49, and the diodes D42 and D43, and the second includes a second control circuit consisting of the transistor Tr41, the resistors R41 to R43, and the diode D41. The phase-compensating capacitors C42 and C41 are installed between the output terminal To and lines of the first and second control circuits through which the drive signals flow, thereby ensuring the stability of operation of the operational amplifier.

The operational amplifier of this embodiment does not need to lower the negative potential of the source voltage to be applied to the second output transistor Tr32 below the negative potential of the dc power supply, thereby eliminating the need for a voltage converter for stepping up the output of the dc power supply as used in the conventional operational amplifier. This facilitates ease of making the operational amplifier of an IC.

Figure 2:
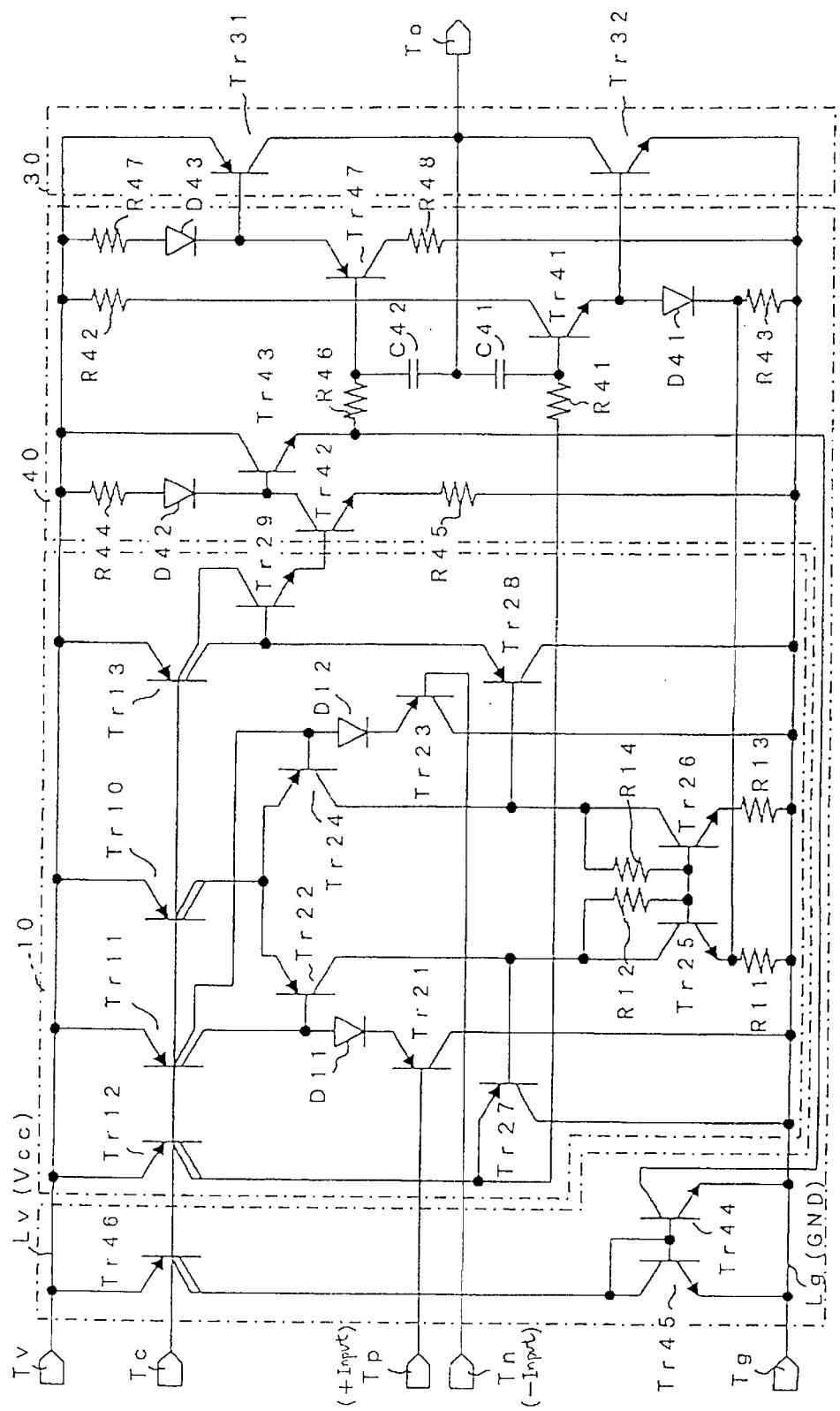
FIG. 2 is a circuit diagram which shows an operational amplifier according to the second embodiment of the invention.

FIG. 2 shows an operational amplifier according to the second embodiment of the invention which is different from the first embodiment in that the first output transistor Tr31 disposed on the positive voltage side of the output circuit 30 is made of a PNP transistor and in part of the control circuit 40 for driving the first output transistor Tr31. Other arrangements are identical, and explanation thereof in detail will be omitted here.

The first output transistor Tr31 of the control circuit 30 is implemented by a PNP transistor which connects at an emitter with the power supply line Lv and at a collector with the output terminal To. In order to drive the first output transistor Tr31 in response to the first signal outputted from the differential amplifier 10 (i.e., the base current supplied from the differential amplifier 10 to the NPN transistor Tr42), the control circuit 40 is so designed that the first output transistor Tr31 is connected at the base directly to the emitter of the PNP transistor Tr47 without use of the PNP transistor Tr48 and the resistor R49 as installed in the control circuit 40 of the first embodiment.

In operation, when the high-level signal is inputted to the inverting input Tn, and the low-level signal is inputted to the non-inverting input Tp, so that the PNP transistor Tr47 is turned off, the first output transistor Tr31 is turned off without flow of current through the resistor R47 connected between the base and the emitter of the first output transistor Tr31 and the diode D43.

Alternatively, when the low-level signal is inputted to the inverting input Tn, and the high-level signal is inputted to the non-inverting input Tp, so that the PNP transistor Tr47 is turned on, it will cause the current to flow through the resistor R47 connected between the base and the emitter of the first output transistor Tr31 and the diode D43 so that the base current flows through the first output transistor Tr31 to turn on the first output transistor Tr31.

When the high-level signal is inputted to the inverting input Tn, and the low-level signal is inputted to the non-inverting input Tp, the second output transistor Tr32 is, like the first embodiment, turned on. Alternatively, when the low-level signal is inputted to the inverting input Tn, and the high-level signal is inputted to the non-inverting input Tp, the second output transistor Tr32 is turned off.

Therefore, a minimum output voltage from the output terminal To when the inverting input Tn is at the high-level, and the non-inverting input Tp is at the low-level is, like the first embodiment, equal to the collector-emitter voltage Vce of the second output transistor Tr32 when turned on. However, since the emitter of the first output transistor Tr31 is connected to the power supply line Lv, a maximum output voltage from the output terminal To when the inverting input Tn is at the low-level, and the non-inverting input Tp is at the high-level will be a value that is a difference (Vcc−Vce) between the collector-emitter voltage Vce of the first output transistor Tr31 and the source voltage Vcc regardless of the base-emitter forward voltage Vf of the first output transistor Tr31.

Specifically, the operational amplifier of this embodiment has the range of Vce to (Vcc−Vce) over which the voltage can be outputted from the output terminal To. This allows a maximum output voltage to be higher than that in the conventional operational amplifier of FIG. 4 by the base-emitter forward voltage Vf (approximately 0.7V) of the first output transistor Tr31 (see a broken line in FIG. 5(b)). The operational amplifier of the second embodiment, therefore, has the output voltage range wider than that of the first embodiment.

The output transistors Tr31 and Tr32 of the output circuit 30 in the first and second embodiments are implemented by bipolar transistors, but they may be made of MOSFETs. Specifically, in the operational amplifier of the first embodiment, the first output transistor Tr31 is made of an n-channel MOSFET which connects at a drain with the power supply line Lv and at a source with the output terminal To, and the second output transistor Tr32 is made of an n-channel MOSFET which connects at a drain with the output terminal To and at a source with the ground line Lg. In the operational amplifier of the second embodiment, the first output transistor Tr31 is made of a p-channel MOSFET which connects at a source with the power supply line Lv and at a drain with the output terminal To, and the second output transistor Tr32 is made of an n-channel MOSFET which connects at a drain with the output terminal To and at a source with the ground line Lg.

Figure 3:
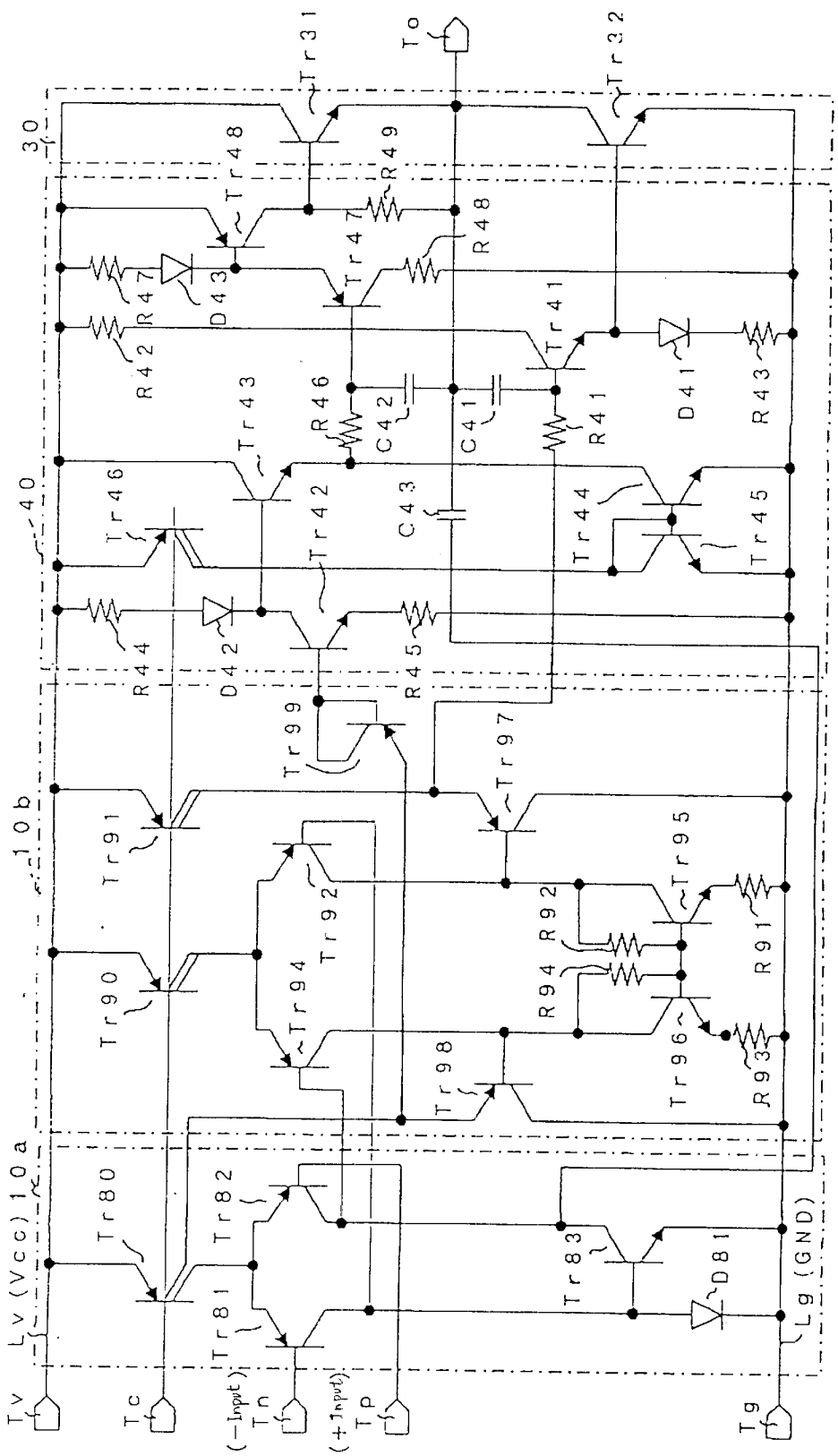
FIG. 3 is a circuit diagram which shows an operational amplifier according to the third embodiment of the invention.

FIG. 3 shows an operational amplifier according to the third embodiment of the invention in which two differential amplifiers are provided at an input stage.

The operational amplifier includes a first differential amplifier 10a, a second differential amplifier 10b, an output circuit 30, and a control circuit 40.

The first differential amplifier 10a is connected to the non-inverting input Tp and the inverting input Tn. The second differential amplifier 10b is installed at a stage following the first differential amplifier 10a. The output circuit 30 is made up of a pair of output transistors Tr31 and Tr32 installed in a current path on the negative voltage side extending from the output terminal To to the ground line Lg. The control circuit 40 controls the output transistors Tr31 and Tr32 as a function of the output of the second differential amplifier 10b and outputs a signal as a function the potential difference between the input signal to the non-inverting input Tp and the input signal to the inverting input Tn from the output terminal To.

The output circuit 30 and the control circuit 40 have the same structures as those in the first embodiment of FIG. 1 except that a third phase-compensating capacitor C43 is installed in the control circuit 40, and explanation thereof in detail will be omitted here.

The differential amplifier 10 includes a PNP transistor Tr80 which connects an emitter with the power supply line Lv leading to a positive voltage terminal of a dc power supply (not shown) through the power supply terminal Tv and at a base thereof with an external constant-current source (not shown) through the current control terminal Tc and works as a constant-current source to output constant currents controlled by the constant-current source from two collectors thereof. The second differentia amplifier 10b includes two PNP transistors Tr90 and Tr91 which work, like the first differential amplifier 10a, as constant-current source.

The first differential amplifier 10a also includes a pair of PNP transistors Tr81 and Tr82 serving as first and second input transistors which connect at bases with the inverting input Tn and the non-inverting input Tp, respectively, and have emitters connected together. To a junction of the emitters of the PNP transistors Tr81 and Tr82, the constant current is supplied from one of the collectors of the PNP transistor Tr80.

The PNP transistor Tr81 connects at the collector with the ground line Lg through a diode D81. The PNP transistor Tr82 connects at the collector with the collector of the NPN transistor Tr83 whose emitter is connected to ground through the ground line Lg. The junction of the collectors of the PNP transistor Tr82 and the NPN transistor Tr83 is coupled to the output terminal To through the phase-compensating capacitor C43 installed in the control circuit 40.

The diode D81 connects at an anode with the collector of the PNP transistor Tr81 and at a cathode with the ground line Lg. The NPN transistor Tr83 connects at a base with a junction of the anode of the diode D81 and the collector of the PNP transistor Tr81.

The second differential amplifier 10b includes PNP transistors Tr92 and Tr94 serving as input transistors. The PNP transistor Tr92 at a base with a current line extending from the collector of the PNP transistor Tr81 to the anode of the diode D81. The PNP transistor Tr94 at a base with a current line extending from the collector of the PNP transistor Tr82 to the collector of the NPN transistor Tr83.

The input transistors Tr92 and Tr94 connect at emitters with each other. A junction of the emitters is coupled to the two collectors of the PNP transistor Tr90 working as a constant current source.

The PNP transistor Tr92 connects at a collector with a collector of an NPN transistor Tr96 which has an emitter coupled to ground through a resistor R93. The PNP transistor Tr94 connects at a collector with a collector of an NPN transistor Tr95 which has an emitter coupled to ground through a resistor R91. The NPN transistors Tr95 and Tr96 have bases connected to each other and emitters connected to the bases thereof through resistors R92 and R94, respectively.

The second differential amplifier also has PNP transistors Tr97 and Tr98 which connect at bases with current lines extending from the collectors of the PNP transistors Tr92 and Tr94 to the collectors of the NPN transistors Tr95 and Tr96, respectively. The PNP transistors Tr97 and Tr98 also connect at collectors with the ground line Lg. The PNP transistor Tr97 connects at an emitter with the collectors of the PNP transistor Tr91. A junction of the emitter of the PNP transistor Tr97 and the collectors of the PNP transistor Tr91 is coupled to the base of the NPN transistor Tr41 of the control circuit 40 through the resistor R41.

The PNP transistor Tr98 connects at an emitter with one of the collectors of the PNP transistor Tr80 installed in the first differential amplifier 10a and at a junction thereof with an emitter of a PNP transistor Tr99. The PNP transistor Tr99 has a base and a collector connected to each other and connects at a junction thereof with the base of the NPN transistor Tr42 installed in the control circuit 40.

Operations of the operational amplifier of this embodiment will be described below. Note that the following discussion will refer only to the operation when each of maximum and minimum voltage signals is outputted from the output terminal To, and no attempt will be made here, like the first embodiment, to describe the operation when a middle voltage signal is outputted from the output terminal To.

When a high-level signal nearly equal to the source voltage Vcc is inputted to the inverting input Tn, and a low-level signal nearly equal to the ground potential is inputted to the non-inverting input Tp, the first input transistor Tr81 is turned off, while the second input transistor Tr82 is turned on. This causes the collector voltage of the PNP transistor Tr82 to rise, so that the PNP transistor Tr94 that is one of the input transistors in the second differential amplifier 10b is turned off to turn on the PNP transistor Tr98.

The PNP transistor Tr99 having the emitter connected to the emitter of the PNP transistor Tr98 works as a diode since it has the base and the collector coupled with each other and a junction thereof coupled to the base of the NPN transistor Tr42 installed in the control circuit 40. However, when the PNP transistor Tr98 is turned off, the bias current is not supplied from the first differential amplifier 10a to the PNP transistor Tr99, thus making it impossible to activate the NPN transistor Tr42 of the control circuit 40, so that the NPN transistor Tr42 is turned off. The NPN transistor Tr43 is, thus, turned on, while the PNP transistors Tr47 and Tr48 are turned off, so that the first output transistor Tr31 is turned off.

When the PNP transistor Tr81 in the first differential amplifier 10a is turned off, it stops a supply of current from the PNP transistor Tr81 to the diode D81, thereby causing the current to flow in a forward direction through the emitter and the base of the PNP transistor Tr92 that is one of the input transistors of the second differential amplifier 10b and reach the diode D81. The PNP transistor Tr92 is, thus, turned on, so that the base potential of the PNP transistor Tr97, thereby turning off the PNP transistor Tr97.

When the PNP transistor Tr97 in the second differential amplifier 10a is turned off, it will cause the base potential of the NPN transistor Tr41 in the control circuit 40 to rise, so that the NPN transistor Tr41 is turned on, thereby turning on the second output transistor Tr32.

Alternatively, when the low-level signal is inputted to the inverting input Tn, and the high-level signal is inputted to the non-inverting input Tp, it will cause the first input transistor Tr81 to be turned on and the second input transistor Tr82 to be turned off in the first differential amplifier 10a. This causes the current to be supplied from the PNP transistor Tr81 to the diode D81, so that the bias current to the PNP transistor Tr92 of the second differential amplifier 10b is stopped to turn off the PNP transistor Tr92. The base potential of the PNP transistor Tr97 is, thus, lowered, so that the PNP transistor Tr97 is turned off, thereby causing the NPN transistor Tr41 of the control circuit 40 and the second output transistor Tr32 to be turned off.

When the PNP transistor Tr82 is, as described above, turned off, it will cause the bias current to flow to the PNP transistor Tr94 of the second differential amplifier 10b through the NPN transistor Tr83, so that the PNP transistor Tr94 is turned on. When the PNP transistor Tr94 is turned on, it will cause the base potential of the PNP transistor Tr98 to rise, so that the PNP transistor Tr98 is turned off, thereby causing the bias current to be supplied to the NPN transistor Tr42 of the control circuit 40 through the PNP transistor Tr99.

Therefore, in the control circuit 40, the NPN transistor Tr42 is turned on, the NPN transistor Tr43 is turned off, and the PNP transistors Tr47 is turned on. The first output transistor Tr31 in the output circuit 30 is also turned on.

Specifically, when the high-level signal is inputted to the inverting input Tn, and the low-level signal is inputted to the non-inverting input Tp, the first output transistor Tr31 is turned off, while the second output transistor Tr32 is turned on, like the first embodiment, so that the output terminal To is connected to the ground line Lg through the second output transistor Tr32. Alternatively, when the low-level signal is inputted to the inverting input Tn, and the high-level signal is inputted to the non-inverting input Tp, the first output transistor Tr31 is turned on, while the second output transistor Tr32 is turned off, so that the output terminal To is connected to the power supply line Lv through the first output transistor Tr31, thereby providing the same effects as those in the first embodiment.

The use of the two differential amplifiers 10a and 10b in the input stage of the operational amplifier allows an input impedance to be increased as compared with the first embodiment. Thus, if the operational amplifier of this embodiment is designed as a load-driving circuit such as the one shown in FIG. 5(a) in which the output terminal To is connected to the inverting input Tn to form a voltage follower for supplying the power to an external load connected to the output terminal To as a function of an input signal to the non-inverting input Tp, it allows a change in output voltage resulting from a change in external load to be minimized, so that the external load can be driven in a stable state.

The operational amplifier of the third embodiment, as described above, uses the output circuit 30 and the control circuit which have the same structures as those in the first embodiment, so that the range over which the voltage can be outputted from the output terminal To is between Vce and (Vcc−((Vf+Vce)), however, the range may fall, like the second embodiment, between Vce and (Vcc−Vce) by employing the same output and control circuits 30 and 40 as those in the second embodiment.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments witch can be embodied without departing from the principle of the invention as set forth in the appended claims.

What is claimed is:

1. An operational amplifier comprising:
    a differential amplifier including a first input transistor connected to an inverting input and a second input transistor connected to a non-inverting input, said differential amplifier being responsive to the input signal to the inverting input to establish a current flow through the first input transistor to provide a first signal and responsive to the input signal to the non-inverting input to establish a current flow through the second input transistor to provide a second signal;
    an output circuit including a first output transistor which is disposed in a current line extending from a positive voltage side of a dc power supply to an output terminal of the operational amplifier and which connects at a first terminal with the positive voltage side of the dc power supply and at a second terminal with the output terminal and a second output transistor which is disposed in a current line extending from a negative voltage side of the dc power supply to the output terminal and which connects at a first terminal with the output terminal and at a second terminal with the negative voltage side of the dc power supply;
    a control circuit supplied with a power from the dc power supply to control said output circuit, said control circuit working to produce a first drive signal to develop a drive voltage across the second terminal and a control terminal of said first output transistor in response to the first signal inputted from said differential amplifier and to produce a second drive signal to develop a drive voltage across the second terminal and a control terminal of said second output transistor in response to the second signal inputted from said differential amplifier so as to output a signal from the output terminal as a function of the potential difference between the input signals to the inverting input and the non-inverting input, said control circuit including a first control circuit designed to be responsive to the first signal outputted from said differential amplifier to control the first drive signal so as to decrease a current flowing through the first output transistor as a potential of the input signal to the inverting input rises and a second control circuit designed to be responsive to the second signal outputted from said differential amplifier to control the second drive signal so as to decrease a current flowing through the second output transistor as a potential of the input signal to the non-inverting input rises; and
    phase-compensating capacitors disposed between the output terminal of the operational amplifier and a portion of the first control circuit leading to the control terminal of the first output transistor and between the output terminal of the operational amplifier and a portion of the second control circuit leading to the control terminal of the second output transistor.

2. An operational amplifier as set forth in claim 1, wherein the first output transistor is implemented by an NPN transistor which has a collector connected to the positive voltage side of the dc power supply as the first terminal, an emitter connected to the output terminal of the operational amplifier as the second terminal, and a base working as the control terminal into which the first drive signal is inputted, and wherein the second output transistor is implemented by an NPN transistor which has a collector connected to the output terminal of the operational amplifier as the first terminal, an emitter connected to the negative voltage side of the dc power supply as the second terminal, and a base working as the control terminal into which the second drive signal is inputted.

3. An operational amplifier as set forth in claim 1, wherein said differential amplifier includes a first differential amplifier circuit having disposed therein the first and second input transistors and a second differential amplifier circuit having a first and a second transistor which are connected to the first and second input transistors, respectively, and which produce the first and second signals as functions of currents flowing through the first and second transistors, respectively.

4. An operational amplifier as set forth in claim 3, wherein the inverting input is coupled to the output terminal to form the operational amplifier as a voltage follower which supplies a power to an external device connected to the output terminal as a function of the input signal to the non-inverting input.

5. An operational amplifier comprising:
a differential amplifier including a first input transistor connected to an inverting input and a second input transistor connected to a non-inverting input, said differential amplifier being responsive to the input signal to the inverting input to establish a current flow through the first input transistor to provide a first signal and responsive to the input signal to the non-inverting input to establish a current flow through the second input transistor to provide a second signal;
an output circuit including a first output transistor which is disposed in a current line extending from a positive voltage side of a dc power supply to an output terminal of the operational amplifier and which connects at a first terminal with the positive voltage side of the dc power supply and at a second terminal with the output terminal and a second output transistor which is disposed in a current line extending from a negative voltage side of the dc power supply to the output terminal and which connects at a first terminal with the output terminal and at a second terminal with the negative voltage side of the dc power supply;
a control circuit supplied with a power from the dc power supply to control said output circuit, said control circuit working to produce a first drive signal to develop a drive voltage across the first terminal and a control terminal of said first output transistor in response to the first signal inputted from said differential amplifier and to produce a second drive signal to develop a drive voltage across the second terminal and a control terminal of said second output transistor in response to the second signal inputted from said differential amplifier so as to output a signal from the output terminal as a function of the potential difference between the input signals to the inverting input and the non-inverting input, said control circuit including a first control circuit designed to be responsive to the first signal outputted from said differential amplifier to control the first drive signal so as to decrease a current flowing through the first output transistor as a potential of the input signal to the inverting input rises and a second control circuit designed to be responsive to the second signal outputted from said differential amplifier to control the second drive signal so as to decrease a current flowing through the second output transistor as a potential of the input signal to the non-inverting input rises; and phase-compensating capacitors disposed between the output terminal of the operational amplifier and a portion of the first control circuit leading to the control terminal of the first output transistor and between the output terminal of the operational amplifier and a portion of the second control circuit leading to the control terminal of the second output transistor.

6. An operational amplifier as set forth in claim 5, wherein the first output transistor is implemented by a PNP transistor which has an emitter connected to the positive voltage side of the dc power supply as the first terminal, a collector connected to the output terminal of the operational amplifier as the second terminal, and a base working as the control terminal into which the first drive signal is inputted, and wherein the second output transistor is implemented by an NPN transistor which has a collector connected to the output terminal of the operational amplifier as the first terminal, an emitter connected to the negative voltage side of the dc power supply as the second terminal, and a base working as the control terminal into which the second drive signal is inputted.

7. An operational amplifier as set forth in claim 5, wherein said differential amplifier includes a first differential amplifier circuit having disposed therein the first and second input transistors and a second differential amplifier circuit having a first and a second transistor which are connected to the first and second input transistors, respectively, and which produce the first and second signals as functions of currents flowing through the first and second transistors, respectively.

8. An operational amplifier as set forth in claim 7, wherein the inverting input is coupled to the output terminal to form the operational amplifier as a voltage follower which supplies a power to an external device connected to the output terminal as a function of the input signal to the non-inverting input.

9. An operation amplifier comprising:
a differential amplifier producing an output signal as a function of a potential difference between an input signal to an inverting input and an input signal to a non-inverting input;
an output circuit including a first output transistor which is disposed in a circuit line extending from a positive voltage side of a dc power supply to an output terminal of the operational amplifier and a second output transistor which is disposed in a circuit line extending from a negative voltage side of the dc power supply to the output terminal; and
a control circuit controlling said output circuit, said control circuit working to produce a first drive signal and a second drive signal having different levels as a function of the output signal from said differential amplifier, the first drive signal working to activate the first output transistor as a function of the level of the first drive signal to establish a connection between the output terminal and the positive voltage side of the dc power supply through the first output transistor, the second drive signal working to activate the second output transistor as a function of the level of the second drive signal to establish a connection between the output terminal and the negative voltage side of the dc power supply through the second output transistor, thereby putting a signal from the output terminal as a function of the potential difference between the input signals to the inverting input and the non-inverting input,
wherein when the input signal to the non-inverting input is at a higher level of potential that is substantially equal to a potential of the positive voltage side of the dc power supply, and the input signal to the inverting input is at a lower level of potential that is substantially equal to a potential of the negative voltage side of the dc power supply, the first drive signal activates the first output transistor to establish the connection between the output terminal and the positive voltage side of the dc power supply, and the second drive signal deactivates the second output transistor to block the connection between the output terminal and the negative voltage side of the dc power supply, when the input signal to the inverting input is at the lower level, and the input signal to the non-inverting input is at the higher level, the first drive signal deactivates the first output transistor to block the connection between the output terminal and the positive voltage side of the dc power supply, and the second drive signal activates the second output transistor to establish the connection between the output terminal and the negative voltage side of the dc power supply.

10. An operational amplifier as set forth in claim 9, wherein the first output transistor is implemented by a bipolar transistor which connects at a collector with the output terminal, at an emitter with the positive voltage side of the dc power supply, and at a base with said control circuit, and wherein the second output transistor is implemented by a bipolar transistor which connects at a collector with the output terminal, at an emitter with the negative voltage side of the dc power supply, and at a base with said control circuit.

11. An operational amplifier as set forth in claim 9, wherein the signal outputted from the output terminal has a voltage range between Vce and (Vcc−((Vf+Vce)), wherein Vce represents a collector emitter voltage of the first output transistor, Vcc represents the positive voltage side and Vf represents a base-emitter forward voltage of the first output transistor.

* * * * *